United States Patent
Charlier et al.

(10) Patent No.: US 6,738,308 B2
(45) Date of Patent: May 18, 2004

(54) ASYNCHRONOUS FLASH-EEPROM BEHAVING LIKE A SYNCHRONOUS RAM/ROM

(75) Inventors: Vincent Jean-Marie Octave Charlier, Auderghem (BE); Carlos Alberto Fernandes, La Garenne (FR)

(73) Assignee: STMicroelectronics N.V., Amsterdam (NL)

( * ) Notice: Subject to any disclaimer, the term of this patent is extended or adjusted under 35 U.S.C. 154(b) by 0 days.

(21) Appl. No.: 10/059,438

(22) Filed: Jan. 31, 2002

(65) Prior Publication Data
US 2002/0114211 A1 Aug. 22, 2002

(30) Foreign Application Priority Data

Feb. 1, 2001 (EP) .............................. 01400256

(51) Int. Cl.[7] ................................ G11C 8/00
(52) U.S. Cl. ....................... 365/233; 365/191
(58) Field of Search .................. 365/233, 218, 365/189.04, 191, 193

(56) References Cited

U.S. PATENT DOCUMENTS

| | | | |
|---|---|---|---|
| 5,333,300 A | | 7/1994 | Fandrich |
| 5,509,143 A | * | 4/1996 | Yates et al. ............... 2/160 |
| 5,590,374 A | * | 12/1996 | Shariff et al. ............. 710/9 |
| 5,825,878 A | * | 10/1998 | Takahashi et al. ........ 713/190 |
| 5,893,135 A | * | 4/1999 | Hasbun et al. ............ 365/120 |
| 5,953,502 A | * | 9/1999 | Helbig, Sr. ............... 714/36 |
| 6,493,647 B1 | * | 12/2002 | Chiang et al. ............ 365/201 |

FOREIGN PATENT DOCUMENTS

DE 196 15 956 A1 11/1996

OTHER PUBLICATIONS

Patent Abstracts of Japan vol. 1998, No. 11, Sep. 30, 1998 & JP 10 172284 A (Hitachi LTD; Hitchi VLSI ENG CORP) Jun. 26, 1998.

* cited by examiner

Primary Examiner—Thong Q. Le
(74) Attorney, Agent, or Firm—Sughrue Mion, PLLC

(57) ABSTRACT

A flash EEPROM memory module acting like a synchronous RAM or ROM, for use in an integrated circuit controlled by a CPU. The module includes an asynchronous flash EEPROM memory with a controllable function and operational mode an interface for communication with a CPU, a state machine arranged to control the function, and a plurality of registers arranged to control the operational mode, the state machine and registers being arranged to be directly controlled by standard CPU signals through the interface.

5 Claims, 3 Drawing Sheets

ASYNCHRONOUS FLASH-EEPROM BEHAVING LIKE A SYNCHRONOUS RAM/ROM

BACKGROUND OF THE INVENTION

The present invention is related to a new type of flash EEPROM wrapper for systems on integrated circuit with embedded flash-EEPROM and CPU.

Integrated systems to interface a flash memory with a CPU are existing. Generally, they combine a direct first Interface with the CPU to access the flash in read operation and a dedicated second interface which support the program/erase functions, either from primary pins of the chip, or from a dedicated programming circuitry.

These existing solutions use two different interfaces for read and program/erase operations, in the case of external interface, some signals needs to be routed to the external world. It is not easy to replace the flash memory by RAM or ROM, both for hardware (modifications in modules, control, . . . ) and software which access the flash memory, especially for program/erase functions.

None of the available prior art flash modules allow a plug-and-play replacement of the flash module by another memory type. Replacement of a flash module usually requires hardware modification to create support for the memory types that will be used in the end product (RAM or ROM in most cases).

SUMMARY OF THE INVENTION

The present invention aims to provide a flash memory module, for use in a system on integrated circuit, which can be replaced easily by another memory type such as RAM or ROM.

The present invention concerns a flash EEPROM memory module acting like a synchronous RAM or ROM, for use in an integrated circuit controlled by a CPU, comprising

- an asynchronous flash EEPROM memory comprising function control means and operational mode control means for setting the memory's functional and operational mode state,
- an interface for communication with a CPU,
- a state machine arranged to control said function control means, and
- a plurality of registers arranged to control said operational control means, characterised in that said state machine and said registers are arranged to be directly controlled by standard CPU signals through said interface. Standard CPU signals as they are used for controlling synchronous RAM or ROM comprises chip select, Read/Write, Address and Data signals.

The function set by the function control means can be selected from the group consisting of Read, Program and Erase.

The operational mode set by the operational mode control means can comprise writing mode, write protection mode, and memory address selection.

The flash EEPROM of the present invention can in a preferred embodiment further comprise a timer controlled by the state machine.

The flash EEPROM can also, if necessary, further comprise a second interface arranged for programming said flash EEPROM from outside the integrated circuit, thus from the external world. Another aspect of the present invention is an integrated circuit controlled by a CPU, characterised in that it comprises a flash EEPROM memory module according to the present invention.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
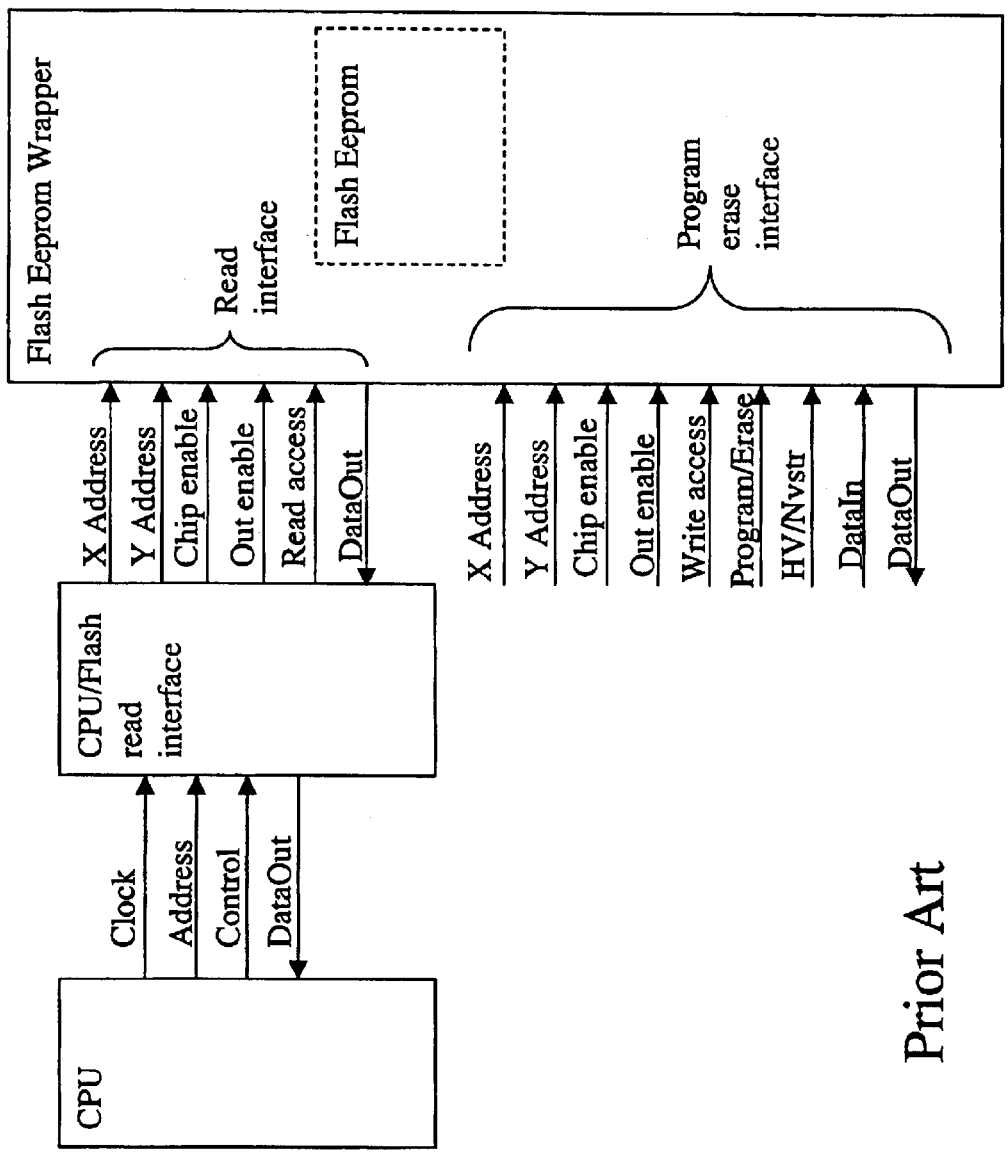
FIG. 1 represents the prior art solution for interfacing between a CPU and a flash memory.

When developing systems on integrated circuit requiring interfacing between a CPU and re-programmable memory, usually an asynchronous flash EEPROM is used, controlled by a CPU using a synchronous bus (Control, Address and Data signals). In the prior art, as can be seen in FIG. 1, two interfaces were needed to provide reading and programming (writing) of the flash's content. Further, as the interfaces were developed for interfacing between the CPU and the flash memory, a hardware change is needed to be able to interface with synchronous RAM or ROM.

Figure 2:
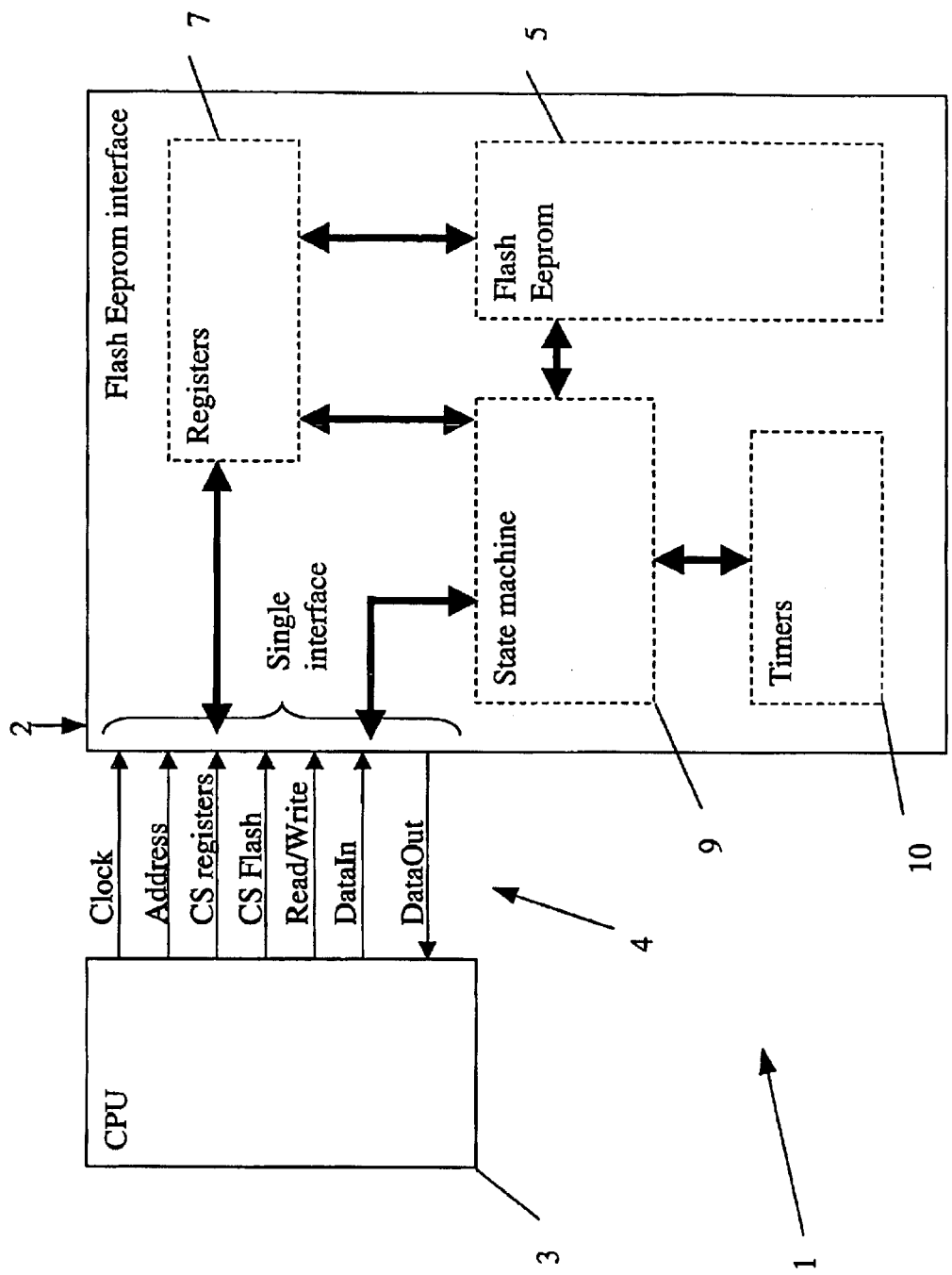
FIG. 2 shows a flash module according to the present invention with only one interface.

A flash memory module 1 according to the present invention is shown in FIG. 2. A CPU 3 interfaces directly with only one interface 2 (both for reading as for writing to the memory) using its standard signals 4. This set-up allows using flash memory in early stages of development, which is convenient for testing and developing code. The standard signals control the registers 7 and the state machine 9. The registers control the operational mode of the flash EEPROM 5, while the state machine controls the timer 10 and the function of the flash EEPROM 5.

In future iteration products, the flash module according to the present invention is replaceable either by a RAM for easiest debugging purposes or by a ROM when the code is stable. In order to reduce the iteration time, replacing the flash memory is done without hardware modification around it, i.e. the flash is removed and the other memory is put into place. In addition, the flash is programmable in-circuit by the processor.

The implemented solution is based on a state machine 9 that drives all the flash control signals for read, program and erase operations. This state machine 9 is controlled by the CPU-bus control signals 4. In addition, some special registers 7 and timers 10 have impact on the state machine 9. The registers 7 define the mode of writing to the flash (program, erase, and mass erase) and to which page of the memory it applies. They might also be used to implement write protection procedure to avoid inadvertent corruption of the data. The timers are used to exercise the value for a certain time required by the flash memory. As write operations take a certain time, one output is added to the module to tell the processor that the flash memory is busy and can not be accessed. In this way, using only one interface 2 (the CPU interface) does all the operations on the flash. Read and Write (meaning program/erase/mass erase) operations are done using standard signals 4 (chip select, Read/Write, Address, Data). For write operations, the added information is stored in the registers by using the same interface, but with a different address and/or chip select signal.

This interface is exactly the same as the one for a synchronous RAM or ROM. In that way, if the flash memory needs to be replaced by a RAM or a ROM, the designer can simply remove the flash memory interface module (comprising the flash memory 5, the state-machine 9 and the registers 7) and put the RAM or ROM in place.

The flash memory can be very easily and quickly replaced by another memory type and its control features are accessible by only one standard interface.

Figure 3:
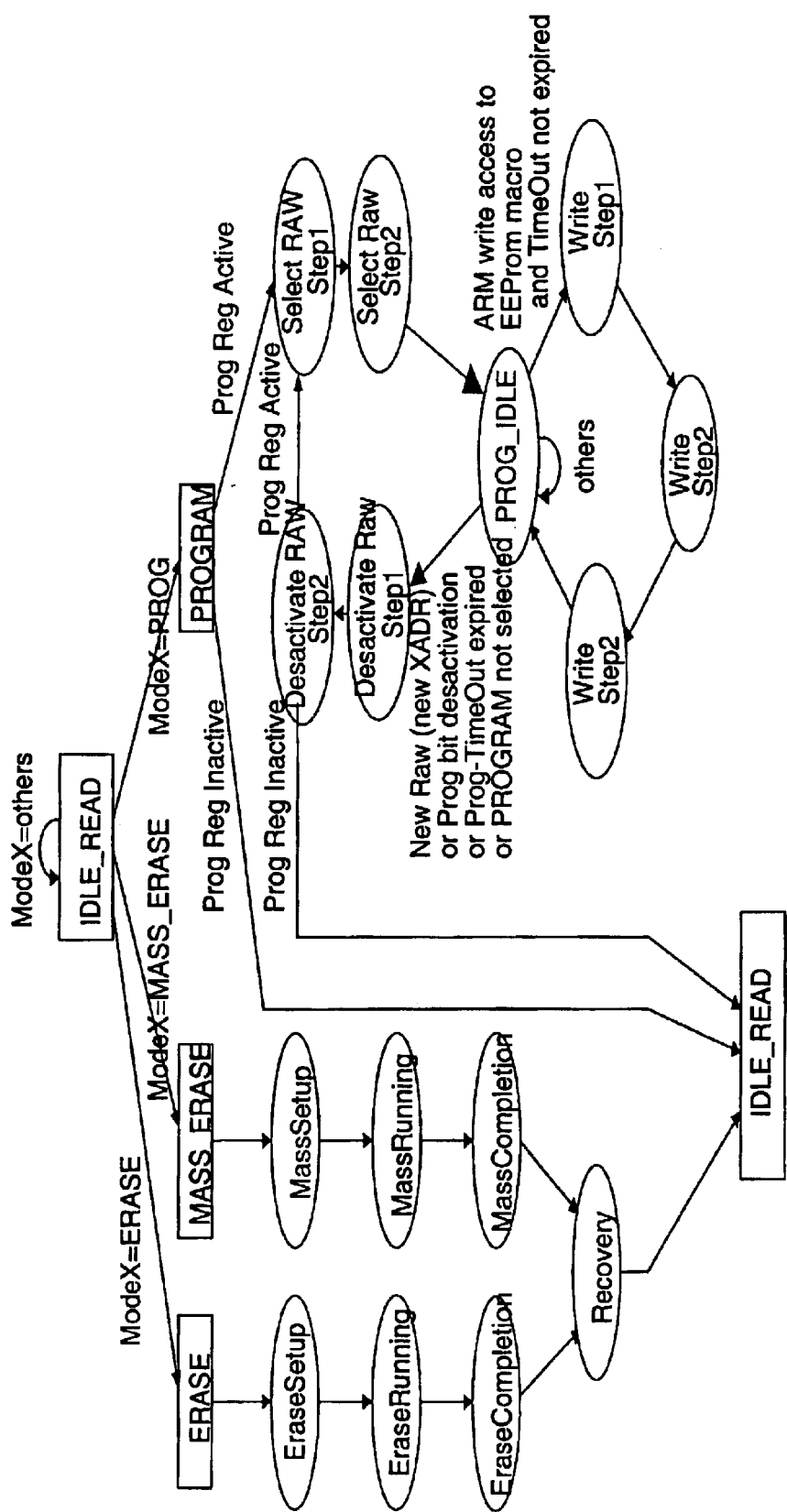
FIG. 3 depicts a diagram of the set-up of the state machine as comprised in the flash memory module of the present invention.

FIG. 3 describes an example of the set-up of the state machine of the flash memory module according to the present invention. The state machine is thus able to set the flash memory in ERASE mode, MASS_ERASE mode or PROGRAM mode.

What is claimed is:

1. A flash EEPROM memory module, comprising:

an asynchronous flash EEPROM memory with a controllable function and operational mode, an interface for communication with a CPU, a state machine arranged to control said function, and a plurality of registers arranged to control said operational mode, wherein said state machine and said registers are directly controlled by standard CPU signals received through said interface, said standard CPU signals controlling synchronous memory, wherein said state machine and said registers adapt said signals controlling synchronous memory to control said asynchronous flash EEPROM memory.

2. A flash EEPROM memory module as in claim 1, wherein said function is selected from the group consisting of Read, Program and Erase.

3. A flash EEPROM memory module as in claim 1, wherein said operational mode is selected from the group consisting of writing mode, write protection mode, and memory address selection.

4. A flash EEPROM memory module as in claim 1, wherein it further comprises a timer controlled by the state machine.

5. An integrated circuit controlled by a CPU, wherein it comprises a flash EEPROM memory module as described in claim 1.

* * * * *